United States Patent [19]

Johnson

[11] Patent Number: 4,855,622
[45] Date of Patent: Aug. 8, 1989

[54] TTL COMPATIBLE SWITCHING CIRCUIT HAVING CONTROLLED RAMP OUTPUT

[75] Inventor: Derrell Q. Johnson, Orem, Utah

[73] Assignee: North American Philips Corporation, Signetics Division, Sunnyvale, Calif.

[21] Appl. No.: 134,494

[22] Filed: Dec. 18, 1987

[51] Int. Cl.⁴ .................. H03K 17/16; H03K 19/088; H03K 00/00
[52] U.S. Cl. .................................. 307/456; 307/443; 307/264; 307/543; 307/557
[58] Field of Search ............... 307/443, 456, 264, 543, 307/557

[56] References Cited

U.S. PATENT DOCUMENTS

| | | | |
|---|---|---|---|
| 4,306,159 | 12/1981 | Wiedmann | 307/456 |
| 4,562,364 | 12/1985 | Tanizawa | 307/454 |
| 4,698,525 | 10/1987 | Tavana et al. | 307/456 |

FOREIGN PATENT DOCUMENTS

| | | | |
|---|---|---|---|
| 0033051 | 8/1984 | Japan . | |
| 0158126 | 9/1984 | Japan | 307/456 |

Primary Examiner—Stanley D. Miller
Assistant Examiner—M. R. Wambach
Attorney, Agent, or Firm—R. Meetin; D. Treacy; T. Briody

[57] ABSTRACT

A TTL compatible buffer circuit responsive to an input signal and having a controlled ramp output is disclosed and includes a low and a high output voltage driver, each driver being comprised of a Darlington pair of transistors, and each driver being separately controlled by its own control circuit. Each control circuit includes at least a capacitor and resistor which are arranged to control the voltage at the base of the upper transistor of the Darlington pair output voltage driver. In this manner, the voltage at the high voltage driver increases in a substantially linear manner when the input signal goes from low to high, and the voltage at the low voltage driver decreases in a substantially linear manner when the input signal goes from high to low. The turn on time of the drivers is thus relatively long. Each control circuit further includes a transistor which permits the respective output voltage driver to turn off quickly. With a quick turn off and a long turn on, a break before make condition is established and voltage supply line bounce due to a feedthrough circuit is eliminated. Voltage supply line bounce due to current flow between the load capacitance at the buffer circuit output and a low voltage source through the low voltage driver upon the turning on of the low voltage driver is also substantially reduced.

18 Claims, 4 Drawing Sheets

TTL COMPATIBLE SWITCHING CIRCUIT HAVING CONTROLLED RAMP OUTPUT

BACKGROUND OF THE INVENTION

1. Field of Use

This invention broadly relates to switching circuits suitable for semiconductor devices. More particularly, this invention relates to buffer circuits which enhance switching in digital gates using logic such as transistor-transistor logic (TTL).

2. Background Art

Figure 1:
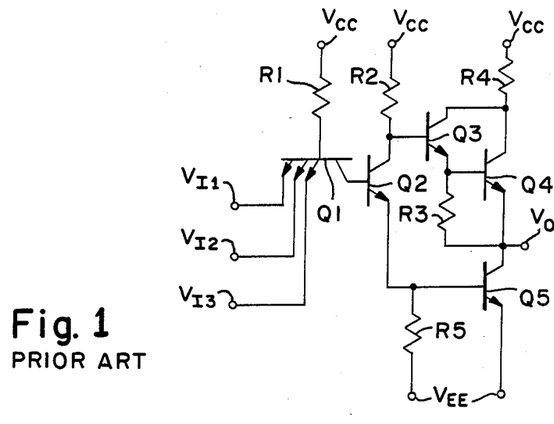
FIG. 1 is a circuit diagram of a conventional TTL inverter.

TTL circuits are derived from a common NAND logic structure such as the conventional arrangement seen in FIG. 1. In the TTL gate of FIG. 1, a set of logical input voltage signals represented by input voltages $V_{I1}$, $V_{I2}$, and $V_{I3}$ are provided to the corresponding emitters of a multiple-emitter NPN input transistor Q1. The collector of transistor Q1 is connected to the base of an NPN phase-splitting drive transistor Q2 in a switching section of the gate. In fact, it is this arrangement which conventionally comprised the distinguishing feature of TTL circuitry. However, the definition of TTL has broadened over a period of time to include elements arranged in diode transistor logic and integrated injection logic format etc., as long as a bipolar device having certain input/output characteristics is provided.

Returning to FIG. 1, the base of transistor Q1 is connected to a current source consisting of a resistor R1 connected to a source of a high supply voltage $V_{CC}$. The Q2 collector is connected to a current source formed by a resistor R2 tied to the $V_{CC}$ supply. The Q2 collector is further connected to the base of an NPN level-shifting transistor Q3. The emitter of transistor Q3 drives an NPN output pull-up transistor Q4 and is coupled through a resistor R3 to the emitter of Q4. The interconnected collectors of the Darlington pair Q3 and Q4 are coupled by a resistor R4 to the $V_{CC}$ supply.

The emitter of transistor Q2 is connected to the base of an NPN output pull-down transistor Q5 whose emitter is connected to a source of a low supply voltage $V_{EE}$. A logical output voltage signal $V_o$ is provided from the interconnection of the Q5 collector and the Q4 emitter. An output pull-down resistor R5 is connected between the $V_{EE}$ supply and the base of transistor Q5.

The operation of the TTL gate of FIG. 1 may be understood by first assuming that each of the digital inputs $V_{I1}$-$V_{I3}$ is at a high value (i.e. logical "1") above the input switching point. Transistor Q1 has its base-collector junction conductively forward biased This enables the R1 current source to provide current through the Q1 base-collector junction to the base of drive transistor Q2 so as to make transistor Q2 conductive. The R2 current source provides current through transistor Q2 to the base of transistor Q5 which is likewise turned on. With transistor Q5 turned on, the output voltage $v_o$ is pulled to a low value (i.e. logical "0") as the collector of transistor Q5 attempts to stabilize at a voltage equal to $V_{EE} + V_{sat}$, ($V_{sat}$ being the standard voltage drop from the collector to the emitter of a bipolar transistor when an increase in the base current produces no change in the collector current). Also, with the collector of Q2 at a low voltage, transistors Q3 and Q4 are turned off. Hence, the output voltage $V_o$ is not affected by the high supply voltage $V_{CC}$ as the current path from $V_{CC}$ to the output is blocked.

If one of the digital input voltages $V_{I1}$-$V_{I3}$ is dropped to a low value below the input switching point so as to conductively forward bias the corresponding Q1 base-emitter junction, transistor Q2 is turned off. With transistor Q2 off, the collector of Q2 goes to a high voltage (due to $V_{CC}$) which causes transistor Q3 to turn on. In turn, transistor Q4 turns on and actively pulls voltage $V_o$ to a high value. At the same time, since transistor Q2 is off, transistor Q5 is turned off and the output is not affected by the low supply voltage $V_{EE}$ as the current path from $V_{EE}$ to the output is blocked.

While the output of the gate of FIG. 1 properly corresponds to the logical NAND of the inputs, various problems arise in the interaction of the integrated circuit gate with the integrated circuit voltage supply lines as well as with the circuitry which loads the output of the gate. With respect to the internal voltage supply lines, it is known that the voltages of these supply lines can "bounce", particularly when the logic transition of the input signal occurs at a high speed. One cause of "bounce" is that with the gate of FIG. 1, it is possible for a short period of time that both transistors Q4 and Q5 will be conducting. Thus, a low resistance feedthrough circuit from $V_{CC}$ to $V_{EE}$ via transistors Q4 and Q5 will be undesirably provided and will tend temporarily to force the low voltage supply line to assume a higher voltage as well as the high voltage supply line to assume a lower voltage until one of the transistors Q4 and Q5 is turned off.

Another cause of voltage supply line bounce is due to the capacitance of the circuit loading the output and the inductance and resistance of the $V_{EE}$ path. During a high to low transition at the output, a built-up charge on the gate output resulting from the capacitance of the load, quickly discharges through transistor Q5. A large current flow through the low resistance of Q5 and out onto the low voltage line causes a voltage drop on the line (i.e. "ground bounce"). Where a large change of current occurs quickly, the inductance of the low voltage line which is in series with the current path causes a change in voltage between the external $V_{EE}$ mains and the internal low voltage line in accord with the relationship $\Delta V = L\, di/dt$, where $\beta V$ is a change in the voltage, L is the inductance, and $di/dt$ is the change in current over time. Similarly, during a low to high transition at the output, the high voltage line $V_{CC}$ will experience bounce as a large current will flow from the high voltage line through R4 and Q4 to charge up the effective capacitor of the load. In conjunction with the quickly changing current, the effective inductance of the $V_{CC}$ path will again cause a change in voltage between the external mains and the internal high voltage line.

Means for partially eliminating ground bounce for a TTL circuit are seen with reference to Japanese Patent Application No. 58-33051 of H. Ozaki, and U.S. Pat. No. #4,562,364 to T. Tanizawa. The Ozaki disclosure provides a circuit similar to that of FIG. 1, except that the collector of the phase splitting drive transistor is connected to both the high power supply $V_{CC}$ via a resistor and to the input terminal of a delay circuit. The output of the delay circuit is connected to the base of the first stage of the Darlington pair which acts as the high output driver. The delay circuit acts to delay the turning on of the high output driver until the low output driver is turned off, and thus eliminates the direct feedthrough current which could flow through the output driving transistors in a low to high transition. The delay circuit, however, does not eliminate possible direct feedthrough during a high to low transition. Nor does the delay circuit eliminate ground bounce caused by transitional currents due to the effective capacitance of the load as aforedescribed.

Figure 2:
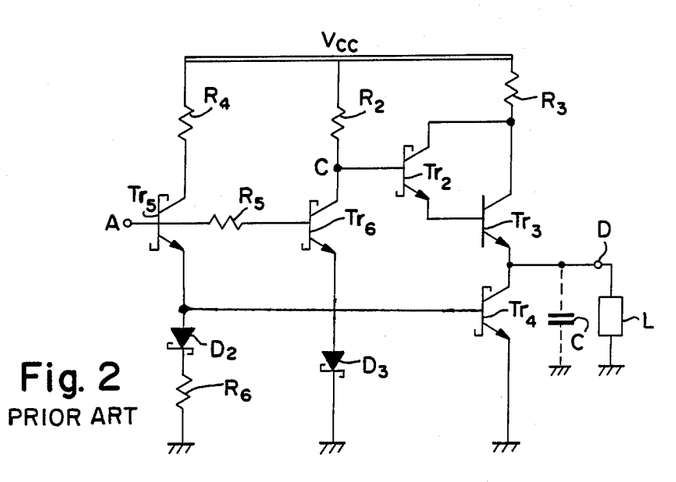
FIG. 2 is a circuit diagram of prior art TTL break before make circuit.

Turning to FIG. 2, the TTL circuit of Tanizawa which eliminates ground bounce due to direct feedthrough from $V_{CC}$ to $V_{EE}$ is shown. The circuit of FIG. 2 eliminates direct feedthrough by forcing the high output drivers (Tr$_2$ and Tr$_3$) off before the low output driver Tr$_4$ is turned on and vice versa. When the input is high, transistor Tr$_5$ conducts, and the low voltage output driver transistor Tr$_4$ is on. At the same time, with a high input, transistor Tr$_6$ is on, and its collector voltage is brought low such that it cannot drive Darlington pair Tr$_2$ and Tr$_3$. With transistor Tr$_4$ on and transistor Tr$_3$ off, the output D is held low. Upon a high-to-low transition of the input, transistor Tr$_4$ will be turned off as soon as the input voltage drops below $2V_{be}$, where $V_{be}$ is the standard voltage across the base-emitter junction of a bipolar transistor when the transistor reaches full conduction in the forward direction. However, at a voltage of $2V_{be}$, transistor Tr$_6$ will still conduct as the voltage drop $v_{sch}$ across Schottky diode D3 is less than $v_{be}$. Hence, transistors Tr$_2$ and Tr$_3$ will remain off until the input voltage drops below $V_{be}+V_{sch}$, at which time transistors Tr$_2$ and Tr$_3$ start conducting and cause the output voltage to go high.

With the output high, when the input starts changing from low to high, the high output voltage driver transistors Tr$_2$ and Tr$_3$ will stop conducting as soon as the input voltage reaches $V_{be}+V_{sch}$, as transistor Tr$_6$ will start conducting at that input voltage. However, the low output voltage driver transistor Tr$_4$ does not turn on until the input voltage reaches $2V_{be}$. As a result, there is a time delay between the turning off of one voltage output driver and the turning on of the other voltage output driver, and except for the situation of a very quickly changing input, line bounce due to a feedthrough path is eliminated with the provided "break before make" circuit. Nonetheless, bounce due to the effective capacitance of the load on the TTL circuit is not eliminated by the Tanizawa circuit.

SUMMARY OF THE INVENTION

It is therefore an object of this invention to provide a switching circuit which substantially eliminates voltage supply line bounce.

It is a further object of this invention to provide a buffer circuit for a TTL gate where voltage supply line bounce is substantially eliminated by arranging the output of the buffer circuit to be a controlled ramp output.

It is yet a further object of this invention to provide a TTL gate buffer circuit which substantially eliminates voltage supply line bounce through its break before make and controlled ramp output characteristics.

In accord with the objects of the invention a TTL buffer circuit responsive to an input signal and having a controlled ramp buffer circuit output is provided and generally comprises:

(a) a bipolar low voltage driver means having an emitter coupled to a low voltage source and a collector coupled to the output of the buffer circuit;

(b) a bipolar high voltage driver means having a collector coupled to a high voltage source and an emitter coupled to the output of the buffer circuit;

(c) driver control means for ensuring that when the voltage level of the input signal goes from a first voltage level to a second voltage level, the bipolar low voltage driver means turns off before the bipolar high voltage driver means turns on, and that when the voltage level of the input signal goes from the second voltage level to the first voltage level, the bipolar high voltage driver means turns off before the bipolar low voltage driver means turns on; and (d) current limiting means for limiting current flow between the output of the buffer circuit and the low voltage source through the bipolar low voltage driver means when the input signal goes from the second voltage level to the first voltage level, and for limiting current flow between the output of the buffer circuit and the high voltage source through the bipolar high voltage driver means when the input signal goes from the first voltage level to the second voltage level.

Each of the bipolar low voltage and high voltage driver means is preferably comprised of two transistors arranged as a Darlington pair. The driver control means is preferably comprised of two circuits with each circuit including at least one transistor, a resistor, and a capacitor. The capacitor in each driver control circuit has one plate coupled to at least the base of the upper (lead) transistor of the Darlington pair as well as to the associated resistor and transistor. With the provided arrangement, the capacitor and resistor provide a circuit with an RC time constant which attempts to keep the voltage at the base of the upper Darlington transistor low and hence the Darlington pair in a non-conducting state for a relatively long period of time during turn-on of the driver. Thus, in turning on the driver, a ramped voltage output at a desired slew rate is obtained. In turning off the driver, the coupling of the capacitor to the collector of the associated transistor permits the driver to be turned off relatively quickly. In this manner, a break before make circuit for each driver is provided with a controlled rise and fall transition of the output.

The provided current limiting means preferably comprises a feedback circuit for each Darlington pair, where the feedback circuit includes the capacitor associated with that Darlington pair. By having the capacitor coupled between the base of the upper transistor of the Darlington pair and the collector of the lower transistor of the Darlington pair, if the voltage at the output pulls up (in the case of the high voltage driver turning on) or down (in the case of the low voltage driver turning on) too quickly, the capacitor will cause the upper transistor of the conducting pair to stop conducting. In this manner the rate of change of the output voltage and hence the flow of current into or out of the output node of the circuit is effectively limited. Because the capacitance of the load cannot dump its entire charge quickly through the buffer circuit, and because the rate of the change of the current is controlled, voltage supply line bounce due to the load capacitance is substantially reduced.

A better understanding of the invention, and additional advantages and objects of the invention will become apparent to those skilled in the art upon reference to the detailed description and the accompanying drawings.

DETAILED DESCRIPTION OF THE PREFERRED EMBODIMENT

Figure 3:
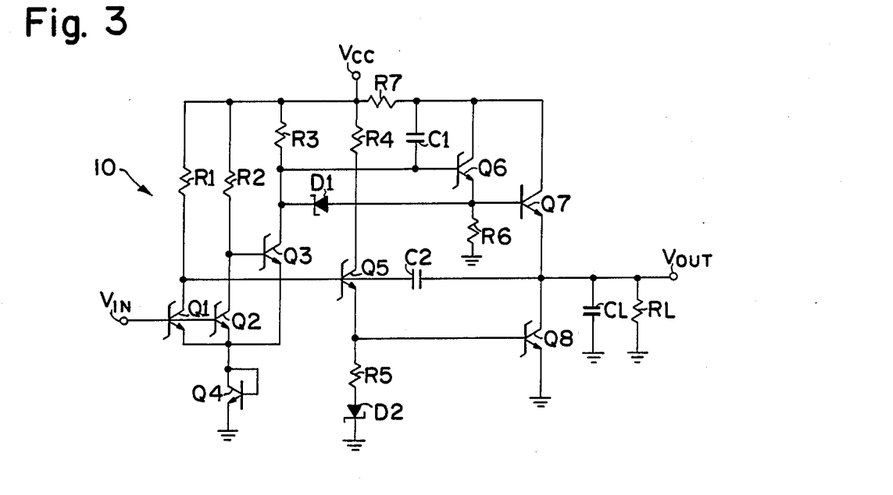
FIG. 3 is a circuit diagram of the TTL compatible switching circuit of the invention which has a controlled ramp output.

The preferred controlled ramp output cell 10 of the invention is comprised of six Schottky clamped transistors Q1, Q2, Q3, Q5, Q6, and Q8, two unclamped NPN transistors Q4 and Q7, seven resistors R1-R7, two capacitors C1 and C2, and two Schottky diodes D1 and D2, all as seen in FIG. 3. In addition, it is assumed that the input $V_{in}$ to the cell will vary in voltage from approximately one volt (a "low" or "0" input) to approximately three volts (a "high" or "1" input), although the invention is not so limited. Likewise, it assumed that the output voltage of the preferred cell should closely mirror the input without excessive time delay or distortion. The output is assumed to be loaded by a high speed circuit with a load having at least an effective resistance (RL) and an effective capacitance (CL), although again, the invention is not so limited.

A close review of FIG. 3 reveals that the circuit 10 is primarily comprised of two driving circuits. The high voltage driver includes a Darlington pair of transistors Q6 and Q7 having their collectors both coupled to a high voltage source $V_{CC}$ via resistor R7, and the emitter of the upper transistor Q6 of the pair connected to the base of the lower transistor Q7. The emitter of transistor Q6 and base of transistor Q7 are also connected to ground through resistor R6. The base of the upper transistor Q6 of the Darlington pair has a capacitor C1 connected across its collector-base junction and a resistor R3 coupling its base to the high voltage source $V_{CC}$. As will be described hereinafter, the capacitor C1 and resistor R3 act together to slow the turn-on of the Darlington pair Q6 and Q7 which act as the high voltage driver. The base of the lower transistor Q7 and the emitter of upper transistor Q6 are also connected to the high voltage source $V_{CC}$ via diode D1 and resistor R3.

The Darlington pair of the high voltage driver is controlled by transistor Q3 which has its collector connected to the base of Darlington pair transistor Q6. In turn, the logic level of transistor Q3 is controlled by the transistor Q2 which has its collector connected to the base of transistor Q3, and has its base controlled by the voltage level of the input. The collector of transistor Q2 and the base of transistor Q3 are connected to the high voltage source $V_{CC}$ through resistor R2. The emitters of transistors Q2 and Q3 are coupled to a low voltage source (ground) via transistor Q4 which is arranged to function as a PN diode.

The second driving circuit (i.e. the low voltage driver) includes a Darlington pair Q5 and Q8 where the emitter of the upper transistor Q5 is connected to the base of the lower transistor Q8. The emitter of transistor Q5 and the base of transistor Q8 are also connected to a low voltage source via resistor R5 and Schottky diode D2. The emitter of the lower transistor Q8 is directly connected to the low voltage source, while the collector of the transistor Q8 is connected to the output node (and to the emitter of transistor Q7 of the upper driver) and to one plate of capacitor C2. The other plate of capacitor is connected to the base of the upper transistor Q5 of the low voltage driving Darlington pair as well as to high voltage source $V_{CC}$ via resistor R1, thereby establishing a second RC circuit to slow the turn-on of the low voltage driver. The collector of transistor Q5 is coupled to the high voltage source $V_{CC}$ via resistor R4.

The Darlington pair of the low voltage driver is controlled by transistor Q1 which has its collector coupled to the base of transistor Q5 as well as to resistor R1 and the second plate of capacitor C2. The base of transistor Q1 is connected to the input into the cell, and hence the voltage of the input controls transistor Q1. The emitter of transistor Q1 is connected commonly with the emitters of transistors Q2 and Q3 to the low voltage source (ground) via transistor Q4.

It should be appreciated that there are many common elements among the upper and lower voltage drivers as well as the circuitry which controls them. For example, each voltage driver has an RC circuit connected to the base of the upper transistor of the Darlington pair to slow down the turning on of the driver thereby establishing a break before make condition. In addition, each RC circuit in conjunction with its associated Darlington pair acts to control and provide a ramped output. Further, the ramped output is made linear by arranging the capacitor of each control circuit to be connected between the base of the upper transistor of the Darlington pair and the collector of the lower transistor of the Darlington pair. This arrangement further limits voltage supply line bounce because the dumping of current by the load capacitance which could cause voltage supply line bounce is limited. Dumping of current would cause the output voltage to move too quickly in one direction with the result that the voltage at the plate of the capacitor connected to the base of the upper transistor of the Darlington pair would change and turn off the transistor.

Figure 4A:
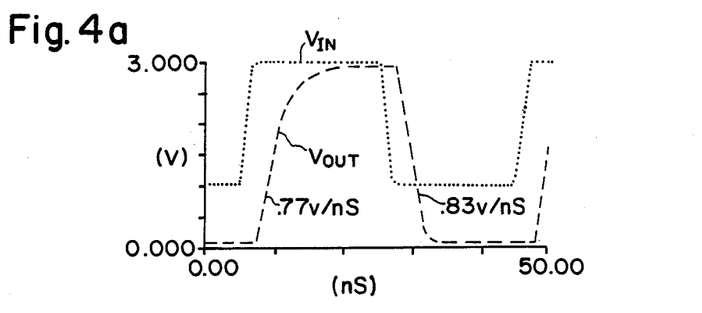
FIGS. 4a and 4b are plots of the input and output voltage and current respectively for the circuit of FIG. 3.
Figure 4B:
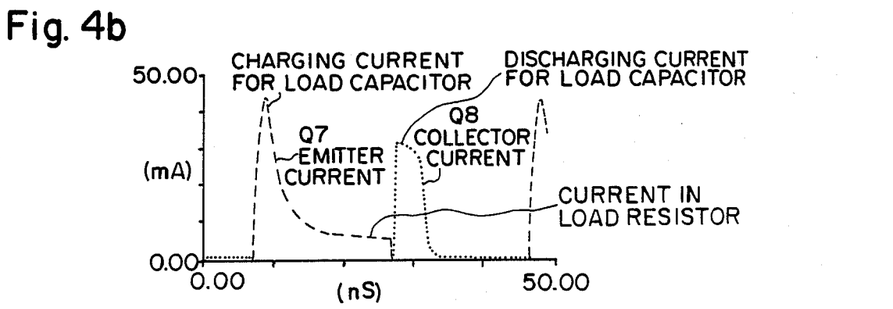

Turning to FIGS. 4a and 4b in conjunction with FIG. 3, the operation of the preferred circuit is seen. At time zero of FIG. 1 it is assumed that the input signal $V_{in}$ is low (approximately 1V as seen on FIG. 4a) and the output signal $V_{out}$ of the circuit is low (approximately 0V as seen on FIG. 4a). With the input low, transistors Q1 and Q2 will be nonconducting because due to transistor Q4, a voltage of approximately $2V_{be}$ is required before the transistors Q1 and Q2 will turn on. With transistor Q1 being off, the voltage at the collector of Q1 is high, and hence transistor Q5 is on. Likewise, with the upper transistor Q5 of the Darlington pair of the low voltage driver being on, the lower transistor Q8 is on. With transistor Q8 on, the voltage at the collector of Q8 is $V_{sat}$ (approximately 0.1V for the provided load), and thus the output voltage is held low. With this arrangement, the plate of capacitor C2 connected to the output of cell 10 will be at a low voltage while the plate of capacitor C2 connected to the base of transistor Q5 will be at a high voltage.

As aforementioned, with a low input voltage, transistor Q2 is turned off and has a high voltage at its collector. With the collector of transistor Q2 connected to the base of transistor Q3, transistor Q3 will be on and provide a current path from $V_{CC}$ to ground (via R3, Q3, and Q4). Thus, the voltage at the collector of transistor Q3 will be held low at approximately 1.2 volts ($V_{sat} + V_{be}$, the drop across transistor Q4 always being $V_{be}$), and the low voltage at the base of transistor Q6 will not permit high voltage driver Darlington pair transistors Q6 and Q7 to turn on. With transistor Q7 nonconducting, the output of cell 10 is driven by conducting transistor Q8. Also, with the voltage at the base of Q6 being low, one plate of capacitor C1 is at a low voltage while the other plate is at a high voltage.

At about five nanoseconds into the time-voltage plot of FIG. 4a, the voltage at the input into cell 10 starts to quickly rise until it reaches a high voltage (3V) approximately one nanosecond later. At an input voltage of approximately $2V_{be}$, transistor Q1 turns on and with the voltage at its collector dropping low to $V_{sat}+V_{be}$, the low voltage driver Darlington pair transistors Q5 and Q8 turn off quickly. Any charge built up on the capacitor C2 quickly drains through transistors Q1 and Q4 which are in low resistance conditions, and thus the capacitor C2 cannot keep the voltage at the base of transistor Q5 high.

At the same time transistor Q1 turns on, transistor Q2 likewise turns on and brings the voltage at its collector low ($V_{sat}+V_{be}$). With a low voltage now at the base of transistor Q3, transistor Q3 turns off, thereby permitting the voltage at the collector of transistor Q3 to go high towards $V_{CC}$. However, because the plate of capacitor C1 connected to the collector of transistor Q3 and base of transistor Q6 was at a low voltage, capacitor C1 attempts to keep the voltage at that junction low. Because there is no low resistance path for charging capacitor C1, the charging must occur through resistor R3, thereby establishing an RC time constant (R3C1) for the rise in the voltage at the base of transistor Q6. Until the voltage at the base of transistor Q6 reaches at least $2V_{be}$ (probably plus a value of $V_{sat}$ at which the output is floating) the high voltage driver Darlington pair transistors Q6 and Q7 do not turn on, and hence the voltage at the output does not start to rise until that time. Compared to the relatively quick shut-off of the low voltage driver transistors, the turn-on time of the high voltage driver is relatively slow, and a break before make arrangement is established (i.e. transistor Q8 is turned off before transistor Q7 is turned on). With no feedthrough path from $V_{CC}$ to ground through driving transistors Q7 and Q8, one cause of voltage supply line bounce is eliminated.

As seen in FIG. 4a, the rise in the output voltage is controlled at a relatively steady rate (i.e. a controlled ramp). The aforementioned RC time constant sets this rate as the voltage at the output should always remain $2V_{be}$ below the voltage at the base of transistor Q6. Moreover, should the voltage at the output attempt to rise too quickly due to the charging of the load capacitance via Q7, transistor Q6 (and thus transistor Q7) will turn off. The turning off of transistor Q6 would occur because the voltage at the base of transistor Q6 must always be at a voltage $2V_{be}$ above the output voltage, and the voltage difference across capacitor C1 cannot change except where the charges on the plates change. Thus, as aforementioned, the only path for charging C1 is via R3, and the charging of C1 and hence the voltage at the base of Q6 is controlled by the R3C1 time constant.

With respect to FIG. 4b, it should be noted that during a low-to-high input voltage transition, the load capacitance will be charged quickly through transistor Q7. A sharp peak for this charging is seen, although this peak is considerably less than what would be seen for an uncontrolled circuit. Also, while Q7 conducts, a steady current through the load resistance will be drawn.

Returning to FIG. 4a, a sharp transition from a high input signal to a low input signal is seen to occur at the twenty-five nanosecond mark. When the input signal drops below $2V_{be}$, transistors Q1 and Q2 turn off. With transistor Q2 off, the voltage at the base of Q3 quickly rises, thereby turning on transistor Q3. With transistor Q3 on, the voltage at the base of transistor Q6 of the high voltage driver Darlington pair drops to approximately $V_{sat}+V_{be}$, and transistor Q6 turns off. Capacitor C1, while having a high voltage on its plate connected to the base of transistor Q6, is ineffective in maintaining the voltage at the base of transistor Q6 as all the charge on the plate quickly drains through transistors Q3 and Q4. As a result, the high voltage driver turns off quickly.

As aforementioned, transistor Q1 also turns off at the same time transistor Q2 turns off. As transistor Q1 turns off, the voltage at its collector starts to rise. However, because the voltage at the plate of capacitor C2 connected to the collector of transistor Q1 is low, and there is no low resistance path through which the charge can quickly drain, capacitor C2 controls the voltage level at the collector of transistor Q1. The voltage at the collector of transistor Q1 is governed by the RC time constant of capacitor C2 and resistor R1 (R1C2) similar to the R3C1 time constant discussed above. With the provided arrangement, the turning on of transistor Q5 of the low voltage driver Darlington pair which has its base connected to the collector of transistor Q1 takes a relatively long period of time compared to the turning off of the high voltage driver (i.e. a break before make circuit is established). Moreover, because the voltage at the base of transistor Q5 increases over time according to the R1C2 time constant, the voltage at the output will be inversely controlled. Such a result follows due to the fact that the voltage across the capacitor C2 can only change along with the charging or discharging of its plates. If the voltage at the output starts to drop too quickly, the voltage on the plate of capacitor C2 connected to the base of transistor Q5 would be forced downward, thereby turning off transistors Q5 and Q8 and stopping the voltage drop.

Because the voltage at the output cannot drop too quickly without forcing capacitor C2 to force transistors Q5 and Q8 off, the charge on the output capacitance cannot drain quickly to ground via transistor Q8. This is so because a quick flow of current will cause the voltage over the load capacitance CL to change quickly. The flow of current through transistor Q8 is thereby control led (Q8 is turned on slowly and acts as a current limiting means in conjunction with transistor Q5 and capacitor C2), and ground bounce due to load capacitance is substantially reduced. Indeed, as seen in FIG. 4b, the current discharging from the load capacitor is controlled over a period of time while, as seen in FIG. 4a the voltage at the output drops at a controlled rate.

According to the preferred embodiment, when the provided circuit 10 is to be used with a high speed circuit, the capacitances of capacitors C1 and C2 are each chosen to be approximately 0.2pF. The resistances of resistors R1–R6 are respectively chosen to be 15K, 15K, 7.5K, 5K, 1K, and 20K ohms, while resistor R7, which is arranged to limit current in case of a short circuit, is chosen to be an appropriate value for the device. With a load resistance RL of 0.5K ohms, and a load inductance CL of 50pF, the slew rate of the output for the low to high transition is approximately 0.77V/ns. Similarly, the slew rate for the high to low transition is approximately 0.63V/ns.

Figure 5A:
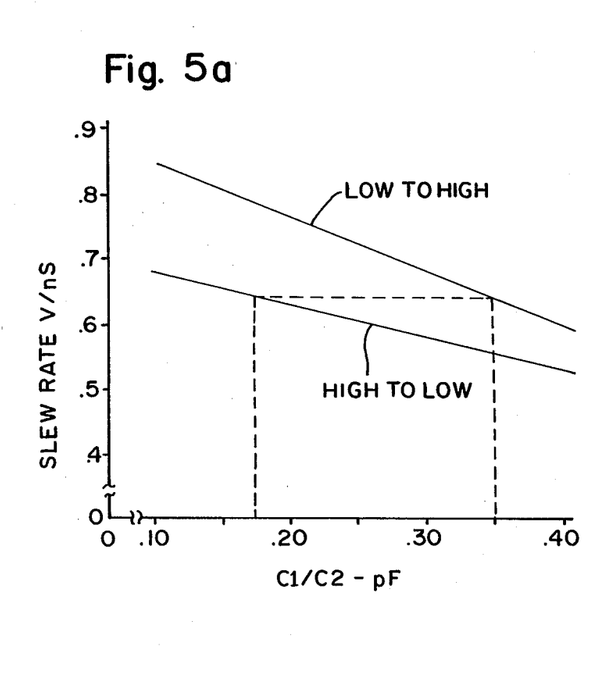
FIGS. 5a and 5b are plots showing the relationship of the feedback capacitor size and the load capacitance respectively to the slew rate of the output.

Turning to FIG. 5a, it is seen that with the resistors R1–R6 given the above-listed values, the high-low and low-high transition slew rates may be controlled by choosing the capacitance of the capacitors C1 and C2. Indeed, if a single slew rate for both transitions is desired, the capacitors can be carefully chosen to provide the same. For example, if a slew rate of approximately 0.65V/ns were desired, capacitor C1 could be chosen to have a capacitance of 0.35pF while capacitor C2 could be chosen to have a capacitance of 0.175pF.

Figure 5B:
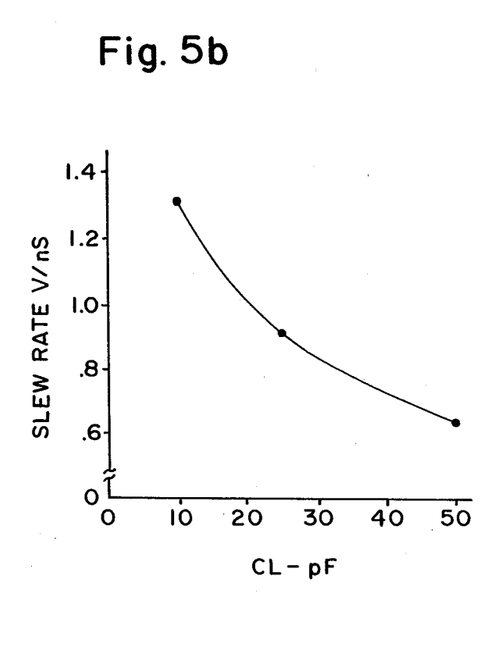
Figure 6:
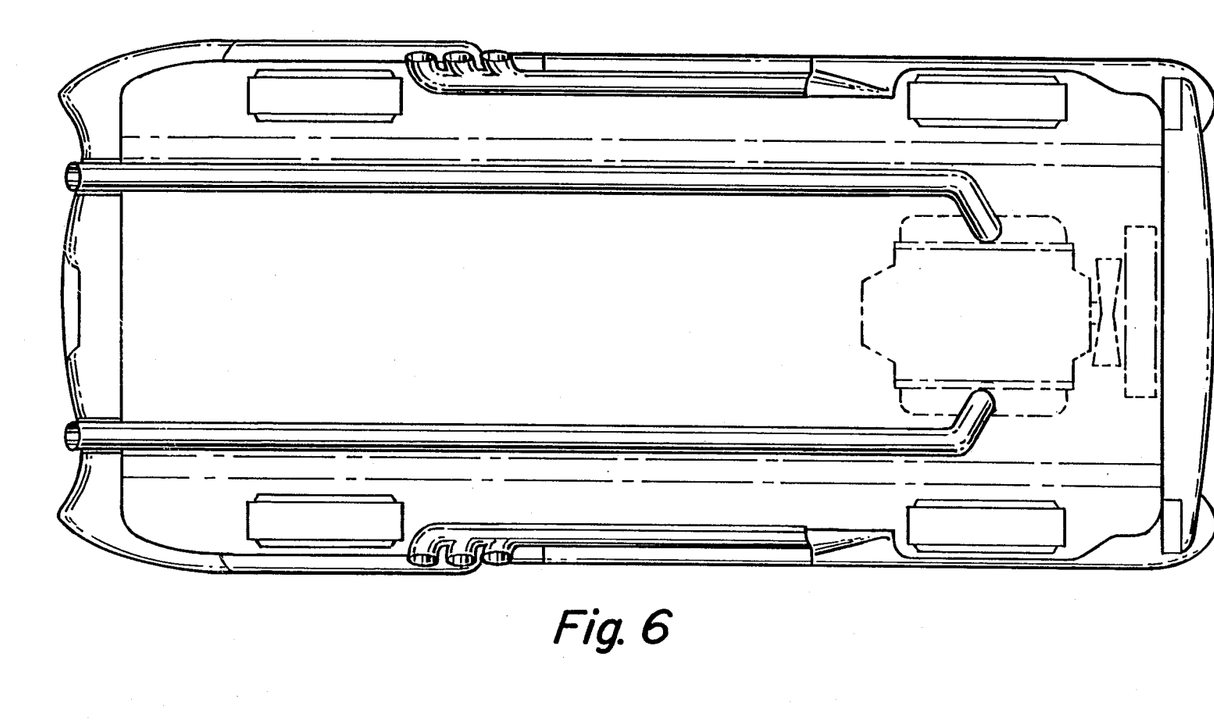

The plot of FIG. 5b indicates that, everything else being equal, the capacitance of the load effects the slew rate of the output. This is true because if the load capacitance is increased, more charge must be discharged through the transistor Q8 to decrease the voltage over the load capacitor; the voltage over the load capacitor being the output voltage. Thus, by knowing the load capacitance, the slew rate may be adjusted as desired (within limits) by adjusting the capacitances of capacitors C1 and C2 and/or of resistors R3 and R2.

There has been described and illustrated herein a TTL buffer circuit having a controlled ramp output. While particular embodiments of the invention have been described, it is not intended that the invention be limited thereby, as it is intended that the invention be broad in scope and that the specifications be read likewise. For example, those skilled in the art will appreciate that while the preferred embodiment uses a plurality of Schottky clamped bipolar NPN transistors and Schottky diodes, other types of transistors (e.g. bipolar PNPs, FETs, etc.) and diodes could be used and can be provided as discrete components or as an integrated circuit. Thus, it is intended that the terminology of the bipolar transistor which includes a collector, a base, and an emitter is to be read broadly to encompass the drain, gate, and source equivalents of a FET, as well as any other three electrode transistor device. Indeed, the transistor may be thought of as a three electrode device with a first flow electrode at which charged carriers (electrons or holes) originate, a second flow electrode at which charged carriers terminate, and a control electrode for regulating the charge flowing between the first and second flow electrodes.

Those skilled in the art will further appreciate that while the transistors of the preferred embodiment were arranged in a particular fashion to provide a non-inverting buffer circuit, the transistors could be rearranged to provide an inverting buffer circuit such as by providing the equivalent of transistor Q1 as the controller of the high voltage driver, and the equivalents of transistors Q2 and Q3 as the controller of the low voltage driver. In fact, other changes to the circuitry to provide the same or similar results will readily suggest themselves to those skilled in the art. Moreover, while various elements of the invention were described according to their functions as output voltage driving means, control means for controlling the output voltage driving means so as to provide a break before make arrangement and a ramped voltage output, and current limiting means for limiting the flow of current onto or from the load capacitance so as to prevent additional ground bounce, various of the elements serve in more than one capacity. For example, the capacitors serve both as part of a control means in providing the ramped output and as part of a current limiting means to substantially eliminate ground bounce due to the load capacitance. Thus, it will be appreciated that other circuits providing the same functions but with different circuitry could be provided but would still fall within the scope of the invention. Further, it will be appreciated that the applications of the provided circuit are not intended to be limited and that the provided circuit can be used as the output of any circuit, especially TTL circuits. Therefore, it will be apparent to those skilled in the art that yet other changes and modifications may be made to the invention as described without departing from the spirit and scope of the invention as so claimed.

I claim:

1. A buffer circuit responsive to an input signal and for providing an output signal at an output thereof, the circuit comprising:
   (a) a low voltage driver means coupled to a low voltage source and to said output of said buffer circuit;
   (b) a high voltage driver means coupled to a high voltage source and to said output of said buffer circuit;
   (c) driver control means for turning said low voltage driver means off before said high voltage driver means turns on when the voltage level of the input signal goes from a first level to a second level, and for turning said high voltage driver means off before said low voltage driver means turns on when the voltage level of the input signal goes from said second level to said first level; and
   (d) current limiting means for controllably limiting current flow between said output of said buffer circuit and said low voltage source through said low voltage driver means when said low voltage driver means turns on.

2. A buffer circuit according to claim 1, wherein:
said current limiting means further controllably limits the current flow between said output of said buffer circuit and said high voltage source through said high voltage driver means when said high voltage driver means turns on.

3. A buffer circuit according to claim 1, wherein:
said low voltage driver means is comprised of a first and a second transistor each having a base, an emitter, and a collector, said emitter of said first transistor coupled to the base of said second transistor, said emitter of said second transistor coupled to said low voltage source, and said collector of said second transistor coupled to said output of said buffer circuit, and
said high voltage driver means is comprised of a third and a fourth transistor each having a base, an emitter, and a collector, said emitter of said third transistor being coupled to said base of said fourth transistor, said collector of said fourth transistor being coupled to said high voltage source, and said emitter of said fourth transistor being coupled to said output of said buffer circuit.

4. A buffer circuit according to claim 1, wherein:
said driver control means further controls the voltage at said output such that when the voltage level of the input signal goes from said first level to said second level, the voltage at said output increases in a controlled manner from a relatively low output level to a relatively high output level, and when said voltage level of the input signal goes from said second level to said first level, the voltage at said output decreases in a controlled manner from a relatively high output level to a relatively low output level.

5. A buffer circuit according to claim 3, wherein:
said driver control means further controls the voltage at the emitter of said high voltage driver means and at the collector of said low voltage driver means such that when the voltage level of the input signal goes from said first level to said second level, the voltage at the emitter of said high voltage driver means increases in a controlled manner from a relatively low output level to a relatively high output level, and when said voltage level of the input signal goes from said second level to said fist level, the voltage at the collector of said low voltage driver means decreases in a controlled manner from a relatively high output level to a relatively low output level.

6. A buffer circuit according to claim 5, wherein:
said driver control means is comprised of a first control circuit for said high voltage driver means and a second control circuit for said low voltage driver means,
said first control circuit comprising
(1) a first control transistor having a collector coupled to the base of said third transistor and arranged to increase the voltage at said base of said third transistor when said input signal goes from said first level to said second level,
(2) a first capacitor having a first plate coupled to said base of said third transistor, and
(3) a first resistor coupled between said high voltage source and said first plate of said capacitor, wherein
said first capacitor and first resistor control the increase of the voltage at the base of said third transistor when said high voltage driver means turns on,
said second control circuit comprising
(1) a second control transistor having a collector coupled to the base of said first transistor and arranged to increase the voltage at said base of said first transistor when said input signal is at a low voltage level,
(2) a second capacitor having a first plate coupled to said base of said first transistor, and
(3) a second resistor coupled between said high voltage source and said first plate of said second capacitor, wherein
said second capacitor and second resistor control the increase of the voltage at the base of said first transistor when said low voltage driver means turns on.

7. A buffer circuit according to claim 6, wherein:
a second plate of said first capacitor is coupled to the collector of said second transistor,
a second plate of said second capacitor is coupled to the collector of said fourth transistor, and
at least said first capacitor controls the increase of voltage at the base of said third transistor in a substantially linear manner, and at least said second capacitor controls the increase of voltage at the base of said first transistor in a substantially linear manner.

8. A buffer circuit according to claim 6, wherein:
each control transistor has an emitter coupled to said low voltage source,
said first control transistor is arranged such that, when said input voltage goes from said second level to said first level, said first control transistor turns on and the voltage at the collector of said first control transistor quickly decreases to a low level, and said first control transistor conducts charge on said first plate of said first capacitor through to said low voltage source, and
said second control transistor is arranged such that, when said input voltage goes from said first level to said second level, said second control transistor turns on and the voltage at the collector of said second control transistor quickly decreases to a low level, and said second control transistor conducts charge on said first plate of said second capacitor through to said low voltage source.

9. A buffer circuit according to claim 8, wherein:
said input signal is received at an input,
said first voltage level is a low voltage level and said second voltage level is a high voltage level, and
said first control circuit of said driver control means further comprises a third control transistor, said third control transistor having a base coupled to said input, a collector coupled to said base of said first control transistor, and an emitter coupled to said low voltage source, wherein said first control circuit is further arranged such that when said input goes from a low voltage level to a high voltage level, said third control transistor turns on and the voltage at the collector of said third control transistor goes low.

10. A buffer circuit according to claim 6, wherein:
said current limiting means comprises said second capacitor and said first and second transistors where a second plate of said second capacitor is coupled to said collector of said second transistor.

11. A buffer circuit according to claim 10, wherein:
said current limiting means further comprises said first capacitor and said third and fourth transistors where a second plate of said first capacitor is coupled to said collector of said fourth transistor.

12. A buffer circuit according to claim 3, wherein:
said current limiting means comprises a capacitor and said first and second transistors where a first plate of said capacitor is coupled to the base of said first transistor, and a second plate of said capacitor is coupled to said collector of said second transistor.

13. A buffer circuit according to claim 12, wherein:
said current limiting means further comprises a second capacitor and said third and fourth transistors where a first plate of said second capacitor is coupled to the base of said third transistor, and a second plate of said capacitor is coupled to said collector of said fourth transistor.

14. A buffer circuit responsive to an input signal and having a controlled ramp output comprising:
(a) a low voltage driver means coupled to a low voltage source and to said output of said buffer circuit;
(b) a high voltage driver means coupled to a high voltage source and to said output of said buffer circuit; and
(c) driver control means for turning said low voltage driver means off before said high voltage driver means turns on when the voltage level of the input signal goes from a low level to a high level, and for turning said high voltage driver means off before said low voltage driver means turns on when the voltage level of the input signal goes from a high level to a low level,
said driver control means further for controlling the voltage at the emitter of said high voltage driver means and at the collector of said low voltage driver means such that when the voltage level of the input signal goes from a low level to a high level, the voltage at the emitter of said high voltage driver means increases in a controlled manner from a relatively low output level to a relatively high output level, and when said voltage level of the input signal goes from a high level to a low level, the voltage at the collector of said low voltage driver means decreases in a controlled manner from a relatively high output level to a relatively low output level.

15. A buffer circuit according to claim 14, wherein:
said low voltage driver means is comprised of a first and a second transistor each having a base, an emitter, and a collector, said emitter of said first transistor coupled to the base of said second transistor, said emitter of said second transistor coupled to said low voltage source and said collector of said second transistor coupled to said output of said buffer circuit, and
said high voltage driver means is comprised of a third and a fourth transistor each having a base, an emitter and a collector, said emitter of said third transistor being coupled to said base of said fourth transistor, said collector of said fourth transistor being coupled to said high voltage source, and said emitter of said fourth transistor being coupled to said output of said buffer circuit.

16. A buffer circuit according to claim 15, wherein:
said driver control means is comprised of a first control circuit for said high voltage driver means and a second control circuit for said low voltage driver means,
said first control circuit comprising
(1) a first control transistor having a collector coupled to the base of said third transistor and arranged to increase the voltage at said base of said third transistor when said input signal is at a first voltage level,
(2) a first capacitor having a first plate coupled to said base of said third transistor, and
(3) a first resistor coupled between said high voltage source and said first plate of said capacitor, wherein
said first capacitor and first resistor control the increase of the voltage at the base of said first transistor when said high voltage driver means turns on,
said second control circuit comprising
(1) a second control transistor having a collector coupled to the base of said first transistor and arranged to increase the voltage at said base of said first transistor when said input signal is at a low voltage level,
(2) a second capacitor having a first plate coupled to said base of said third transistor, and
(3) a second resistor coupled between said high voltage source and said first plate of said second capacitor, wherein
said second capacitor and second resistor control the increase of the voltage at the base of said first transistor when said low voltage driver means turns on.

17. A buffer circuit according to claim 16, wherein:
each control transistor has an emitter coupled to said low voltage source,
said first control transistor is arranged such that, when said input voltage goes from said second level to said first level, said first control transistor turns on and the voltage at the collector of said first control transistor quickly decreases to a low level, and said first control transistor conducts charge on said first plate of said first capacitor through to said low voltage source, and
said second control transistor is arranged such that, when said input voltage goes from said first level to said second level, said second control transistor turns on and the voltage at the collector of said second control transistor quickly decreases to a low level, and said second control transistor conducts charge on said first plate of said second capacitor through to said low voltage source.

18. A buffer circuit according to claim 17, wherein:
said input signal is received at an input,
said first voltage level is a low voltage level and said second voltage level is a high voltage level, and
said first control circuit of said driver control means further comprises a third control transistor, said third control transistor having a base coupled to said input, a collector coupled to said base of said first control transistor, and an emitter coupled to said low voltage source, wherein said first control circuit is further arranged such that when said input goes from a low voltage level to a high voltage level, said third control transistor turns on and the voltage at the collector of said third control transistor goes low.

* * * * *

UNITED STATES PATENT AND TRADEMARK OFFICE
CERTIFICATE OF CORRECTION

PATENT NO. : 4,855,622

DATED : August 8, 1989

INVENTOR(S) : Derrell Q. Johnson

It is certified that error appears in the above-identified patent and that said Letters Patent is hereby corrected as shown below:

Delete Fig. "6".

Signed and Sealed this

Nineteenth Day of June, 1990

Attest:

HARRY F. MANBECK, JR.

*Attesting Officer*     *Commissioner of Patents and Trademarks*